(12) United States Patent
Streppel (10) Patent No.: US 9,874,663 B2
(45) Date of Patent: Jan. 23, 2018

(54) OPTICAL ELEMENT AND OPTOELECTRONIC COMPONENT COMPRISING OPTICAL ELEMENT

(71) Applicant: OSRAM Opto Semiconductors GmbH, Regensburg (DE)

(72) Inventor: Ulrich Streppel, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/775,327

(22) PCT Filed: Feb. 26, 2014

(86) PCT No.: PCT/EP2014/053712
§ 371 (c)(1),
(2) Date: Sep. 11, 2015

(87) PCT Pub. No.: WO2014/139797
PCT Pub. Date: Sep. 18, 2014

(65) Prior Publication Data
US 2016/0033689 A1    Feb. 4, 2016

(30) Foreign Application Priority Data
Mar. 14, 2013   (DE) .................. 10 2013 204 476

(51) Int. Cl.
*H01L 29/22* (2006.01)
*G02B 3/08* (2006.01)
(Continued)

(52) U.S. Cl.
CPC ............... *G02B 3/08* (2013.01); *F21V 5/005* (2013.01); *F21V 5/02* (2013.01); *F21V 5/043* (2013.01); *F21V 5/045* (2013.01); *G02B 3/06* (2013.01); *G02B 5/0231* (2013.01); *G02B 5/0278* (2013.01); *G02B 7/02* (2013.01); *G02B 17/006* (2013.01); *G02B 19/0014* (2013.01); *G02B 19/0061* (2013.01); *G02B 27/0955* (2013.01); *H01L 33/505* (2013.01); *H01L 33/507* (2013.01); *H01L 33/508* (2013.01); *H01L 33/58* (2013.01); *F21Y 2101/00* (2013.01);*F21Y 2115/10* (2016.08); *H01L 2924/0002* (2013.01); *H01L 2924/19107* (2013.01)

(58) Field of Classification Search
CPC ........... G02B 3/08; F21V 5/045; H01L 33/50; H01L 33/505; H01L 33/507; H01L 33/508
USPC ..................................... 257/98, 99
See application file for complete search history.

(56) References Cited

U.S. PATENT DOCUMENTS 1,076,628 A * 10/1913 Churchill .................. F21V 5/00
362/337
2,773,172 A   12/1956 Pennow
(Continued)

FOREIGN PATENT DOCUMENTS

| DE | 10 2005 001 954 A1 | 9/2005 |
|----|--------------------|--------|
| DE | 10 2006 013 343 A1 | 9/2007 |
| EP | 0 290 347 A2       | 11/1988 |
| WO | 96/31742 A1        | 10/1996 |
| WO | 99/50596 A2        | 10/1999 |

Primary Examiner — Matthew E Warren
(74) Attorney, Agent, or Firm — DLA Piper LLP (US)

(57) ABSTRACT

An optical element has a first surface and a second surface, wherein a tooth structure having a multiplicity of teeth oriented in a second direction is arranged on the first surface, a stepped lens having a multiplicity of steps oriented in a first direction is arranged on the second surface, and the tooth structure forms a total internal reflection lens.

20 Claims, 5 Drawing Sheets

(51) Int. Cl.

| | |
|---|---|
| *H01L 33/50* | (2010.01) |
| *F21V 5/00* | (2015.01) |
| *F21V 5/02* | (2006.01) |
| *F21V 5/04* | (2006.01) |
| *G02B 3/06* | (2006.01) |
| *G02B 5/02* | (2006.01) |
| *H01L 33/58* | (2010.01) |
| *G02B 19/00* | (2006.01) |
| *G02B 7/02* | (2006.01) |
| *G02B 17/00* | (2006.01) |
| *G02B 27/09* | (2006.01) |
| *F21Y 101/00* | (2016.01) |
| *F21Y 115/10* | (2016.01) |

(56) References Cited

U.S. PATENT DOCUMENTS

| | | | |
|---|---|---|---|
| 4,688,905 A | | 8/1987 | Okamura |
| 4,859,043 A | * | 8/1989 | Carel ............... F21S 48/2212 |
| | | | 359/710 |
| 4,936,657 A | * | 6/1990 | Tejima ............... G02B 3/08 |
| | | | 348/E5.141 |
| 8,068,288 B1 | * | 11/2011 | Pitou ............... G02B 3/08 |
| | | | 359/743 |
| 2004/0196562 A1 | | 10/2004 | Watanabe et al. |
| 2010/0172027 A1 | * | 7/2010 | Yamada ............... G02B 3/08 |
| | | | 359/601 |
| 2014/0239336 A1 | * | 8/2014 | Streppel ............... F21V 5/045 |
| | | | 257/98 |

\* cited by examiner

OPTICAL ELEMENT AND OPTOELECTRONIC COMPONENT COMPRISING OPTICAL ELEMENT

TECHNICAL FIELD

This disclosure relates to an optical element and an optoelectronic component comprising an optical element.

This application claims the priority of German Patent Application 10 2013 204 476.3, the disclosure content of which is incorporated here by reference.

BACKGROUND

It is known to provide optoelectronic components, for example, light-emitting diode components with optical elements for beam shaping. In this case, it is desirable to configure an optical element such that, except for an optically active region of the optoelectronic component, no other parts of the optoelectronic component are visible from outside an optoelectronic component. This is achieved by optical elements consisting of diffuse lens material or by providing different diffuse elements such as scattering plates. This, however, involves large efficiency losses. It is also known to provide optical elements with rotationally symmetrical or elliptical step structures having a small structure size. In such arrangements, however, unachievably fine structure sizes are required in central regions so that an imaging quality in this region is reduced.

SUMMARY

I provide an optical element having a first surface and a second surface, wherein a tooth structure having a multiplicity of teeth oriented in a second direction is arranged on the first surface, a stepped lens having a multiplicity of steps oriented in a first direction is arranged on the second surface, and the tooth structure forms a total internal reflection lens.

I further provide an optoelectronic component having an optoelectronic semiconductor chip and an optical element.

LIST OF REFERENCES

10 x direction
20 y direction
30 z direction
40 angle
100 optical element
110 first surface
111 midpoint
120 second surface
130 frame
131 cavity
140 surface distance
150 radiation exit point
200 tooth structure
210 tooth
211 first tooth
212 second tooth
220 average tooth height
221 first tooth height
222 second tooth height
230 average tooth spacing
240 curvature
241 radius of curvature
250 curve depth
260 first ray profile
261 first emitted ray
262 first refracted ray
263 first totally reflected ray
270 second ray profile
271 second emitted ray
272 second refracted ray
273 second totally reflected ray
300 stepped lens structure
310 step
311 first step
312 second step
320 maximum step height
321 first step height
322 second step height
330 average step spacing
360 third ray profile
361 third emitted ray
362 third refracted ray
363 third re-refracted ray
370 fourth ray profile
371 fourth emitted ray
372 fourth refracted ray
373 fourth re-refracted ray
400 optoelectronic component
410 optoelectronic semiconductor chip
411 radiation emission surface
412 edge length
420 carrier
421 bonding wire
430 chip distance

DETAILED DESCRIPTION

My optical element has a first surface and a second surface. A tooth structure having a multiplicity of teeth oriented in a second direction is arranged on the first surface. A stepped lens having a multiplicity of steps oriented in a first direction is arranged on the second surface. Advantageously, the tooth structure on the first surface of the optical element leads to beam shaping in a plane perpendicular to the second direction. The stepped lens structure on the second surface of this optical element may lead to beam shaping in a plane perpendicular to the first direction. Because of the essentially linear configuration of the teeth of the tooth structure and of the steps of the stepped lens structure, these can advantageously be produced more easily than elliptical or rotationally symmetrical structures. One particular advantage is that the tooth structure on the first surface has structure sizes in a central region of the first surface which essentially correspond to the structure sizes of the tooth structure in other regions of the first surface. The first surface therefore also has significant structuring in its central region so that rays passing through the central region of the optical element are also subject to beam shaping. In this way, the optical element appears nontransparent in its central region. The effect is advantageously achieved by purely refractive and reflective means and, therefore, does not entail any large efficiency loss.

The first direction and second direction may make an angle of 85° to 95° between them. Preferably, the first direction and the second direction are arranged perpendicularly to one another. Advantageously, the tooth structure and the stepped lens structure of the optical element can then lead to light refraction in two planes oriented approximately perpendicularly to one another so that full beam shaping is made possible.

The tooth structure may form a total internal reflection lens. Advantageously, the tooth structure therefore allows loss-free ray deviation through large angles.

A midpoint of the first surface may be covered by the tooth structure. Advantageously, light rays are then also subject to ray deviation in the central region of the optical element.

The optical element may comprise an optically transparent plastic. Advantageously, the optical element is therefore simple and economical to produce. For example, the optical element may be produced by an injection molding method in large production numbers.

The first surface and the second surface may be configured essentially rectangularly. Advantageously, the optical element is then suitable particularly for illumination of rectangular surfaces, as is required in many technical fields.

The optical element may comprise a frame which encloses the first surface and the second surface. Advantageously, the frame allows connection of the optical element to a carrier of an optoelectronic component so that the optoelectronic component can be produced simply and from few individual parts.

The optical element may shape a radiation profile of an electromagnetic radiation emerging from a radiation surface having a defined edge length. Advantageously, the optical element may lead to collimation of the electromagnetic radiation emerging from the radiation surface.

The teeth of the tooth structure may have an average tooth height of 5% to 20% of the edge length. Advantageously, the tooth height of the teeth of the tooth structure is therefore adapted to the edge length of the radiation surface.

Two teeth of the tooth structure may have different tooth heights. Advantageously, a high imaging quality can therefore be ensured over the entire size of the first surface of the optical element.

Two neighboring teeth of the tooth structure may have a tooth spacing of 5% to 20% of the edge length. Advantageously, the spacing of the teeth of the tooth structure is therefore adapted to the edge length of the radiation surface.

The teeth of the tooth structure may be curved in a plane perpendicular to the first direction. In this case, the curvature has a radius of curvature of at least two times the edge length. Advantageously, the tooth structure therefore already leads to a certain collimation of the electromagnetic radiation in the plane perpendicular to the first direction.

The steps of the stepped lens structure may have a maximum step height of 5% to 20% of the edge length. Advantageously, the step height of the stepped lens structure is therefore adapted to the edge length of the radiation surface.

Two steps of the stepped lens structure may have different step heights. Advantageously, a high imaging quality of the stepped lens structure can therefore be achieved over the entire size of the stepped lens structure. Two neighboring steps of the stepped lens structure may have a step spacing of 5% to 30% of the edge length. Advantageously, the step spacing of the steps of the stepped lens structure is therefore adapted to the edge length of the radiation surface.

The tooth structure and the stepped lens structure may have a distance between them of 30% to 120% of the edge length. Advantageously, the distance between the tooth structure and the stepped lens structure is therefore adapted to the edge length of the radiation surface.

A central section of the tooth structure may be further away from the stepped lens structure than a lateral section of the tooth structure by a length. In this case, the length is 20% to 50% of the edge length. Advantageously, this supports a high image quality of the optical element over the entire surface of the tooth structure.

An optoelectronic component has an optoelectronic semiconductor chip and an optical element of the aforementioned type. Advantageously, the optical element of this optoelectronic component may lead to beam shaping of electromagnetic radiation emitted by the optoelectronic semiconductor chip so that the radiation emitted by the optoelectronic semiconductor chip can be deviated efficiently into a desired direction. At the same time, the optical element prevents visibility of further parts of the optoelectronic component from the outside.

In the optoelectronic component, the first surface of the optical element may face toward the optoelectronic semiconductor chip. Advantageously, the electromagnetic radiation emitted by the optoelectronic semiconductor chip can therefore be deviated first in a plane perpendicular to the second direction by the tooth structure arranged on the first surface and, subsequently, in a plane perpendicular to the first direction by the stepped lens structure arranged on the second surface, of the optical element.

An upper side facing toward the optical element of the optoelectronic semiconductor chip may have a distance from the first surface of the optical element which is 20% to 70% of an edge length of a radiation emission surface of the optoelectronic semiconductor chip. Advantageously, the distance between the optoelectronic semiconductor chip and the optical element is then adapted to the size of the radiation emission surface.

The properties, features and advantages as described above, and the way in which they are achieved, will become more clearly and readily comprehensible in conjunction with the following description of examples, which will be explained in more detail in connection with the drawings.

Figure 1:
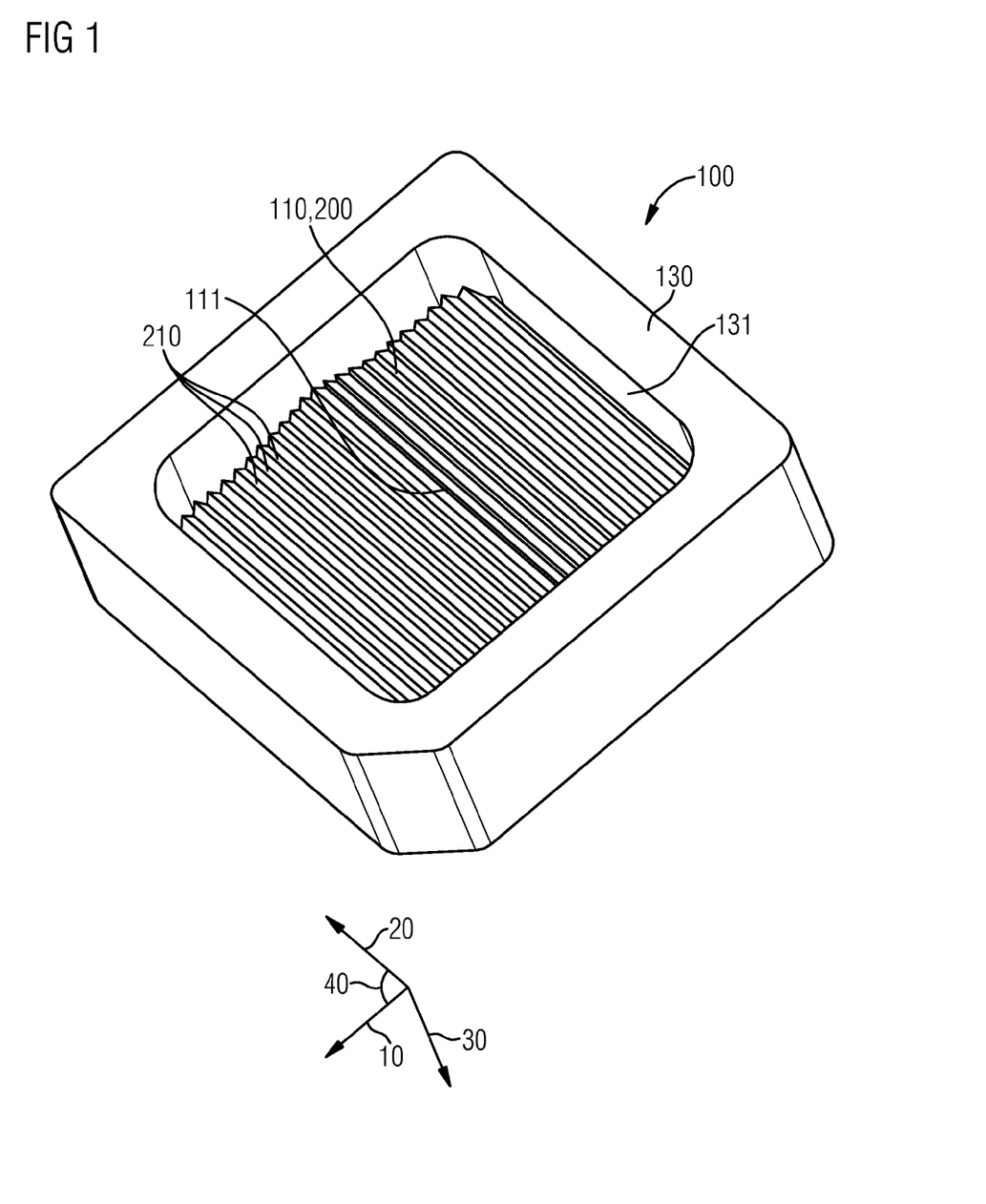
FIG. 1 shows a perspective view of a first surface of an optical element.
Figure 2:
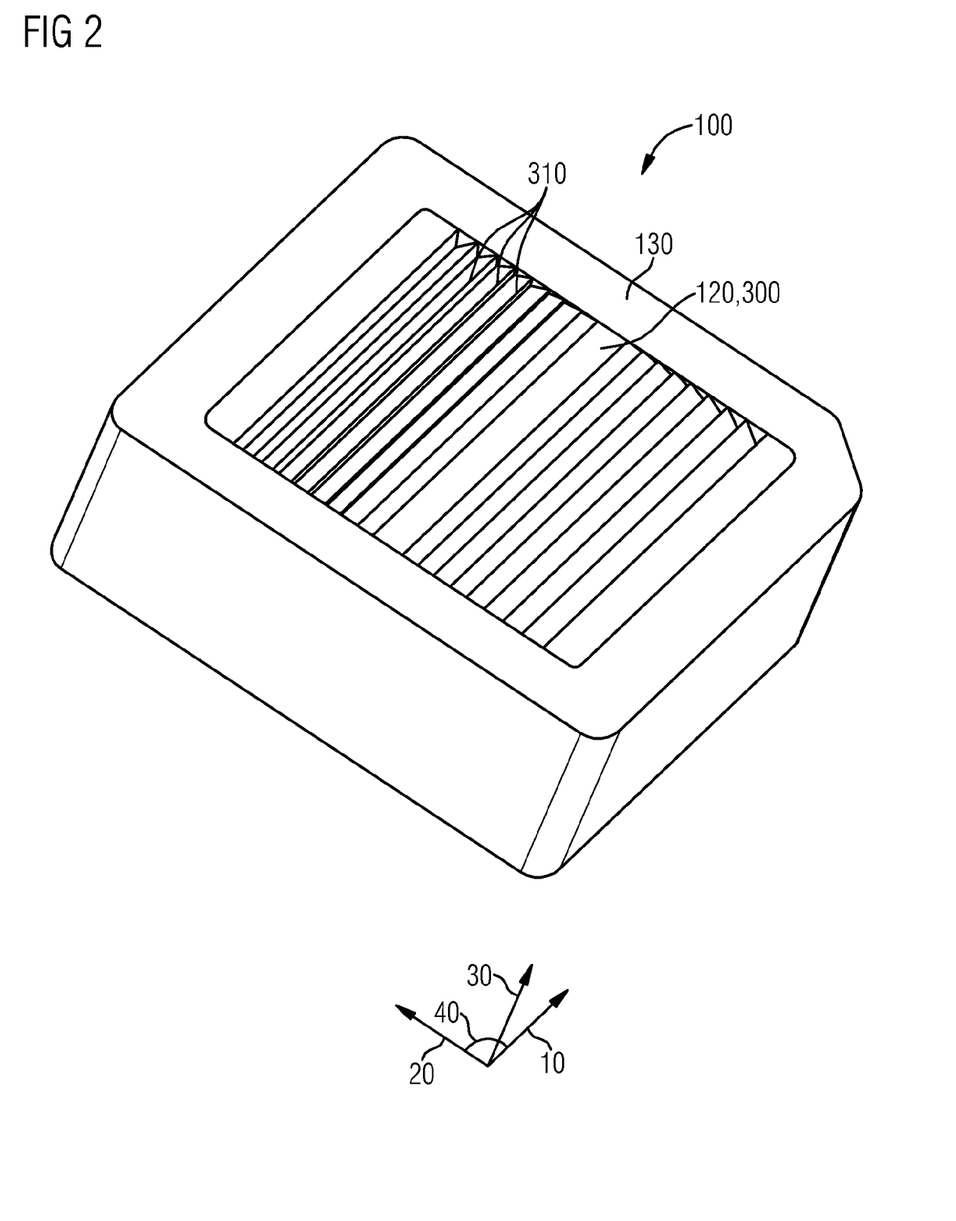
FIG. 2 shows a perspective view of a second surface of an optical element.

FIG. 1 shows a perspective representation of an optical element 100. FIG. 2 shows a perspective representation of the optical element 100 from a different viewing direction.

The optical element 100 may be used for covering and beam shaping of an optoelectronic component, for example, a light-emitting diode component. The optical element 100 is preferably formed in one piece and may, for example, be produced by an injection molding method. The optical element 100 consists of an optically transparent material. In particular, the optical element 100 may be made of an optically transparent plastic.

The optical element 100 comprises an essentially rectangular frame 130. The frame 130 has two frame parts arranged parallel to an x direction 10, and two frame parts arranged parallel to a y direction 20. The frame 130 is therefore oriented perpendicularly to a z direction 30 arranged perpendicularly to the x direction 10 and the y direction 20.

The frame 130 of the optical element 100 encloses an essentially rectangular central region of the optical element 100 which has a first surface 110 that points in a spatial direction opposite to the z direction 30. On its opposite side from the first surface 110, the central region of the optical element 100 has a second surface 120 oriented in the z direction 30. The first surface 110 is set back relative to the frame 130 of the optical element 100 so that a cavity 131 enclosed by the frame 130 is formed above the first surface 110. FIG. 1 shows the first surface 110 of the optical element 100. FIG. 2 shows the second surface 120.

The first surface 110 of the optical element 100 has a tooth structure 200 with a multiplicity of teeth 210 oriented in the y direction 20. The teeth 210 may be configured to be straight and parallel to the y direction 20. The teeth 210 of the tooth structure 200 may, however, also have a slight curvature in the longitudinal direction about an axis oriented in the x direction 10. In this case, only a main extent direction of the teeth 210 of the tooth structure 200 is oriented in the y direction.

A stepped lens structure 300 having a multiplicity of steps 310 oriented in the x direction 10 is formed on the second surface 120 of the optical element 100. The steps 310 of the stepped lens structure 300 may be configured to be straight and parallel to the x direction 10. The steps 310 of the stepped lens structure 300 may, however, also be curved slightly in their longitudinal direction about an axis oriented in the y direction 20. In this case, only a main extent direction of steps 310 of the stepped lens structure 300 is oriented in the x direction 10.

Between the longitudinal extent direction of the teeth 210 of the tooth structure 200 and the longitudinal extent direction of the steps 310 of the stepped lens structure 300, there is an angle 40. The angle 40 is preferably 90°. The angle 40 may, however, also have a value other than 90°. The angle 40 in this case preferably is 85° to 95°.

Figure 3:
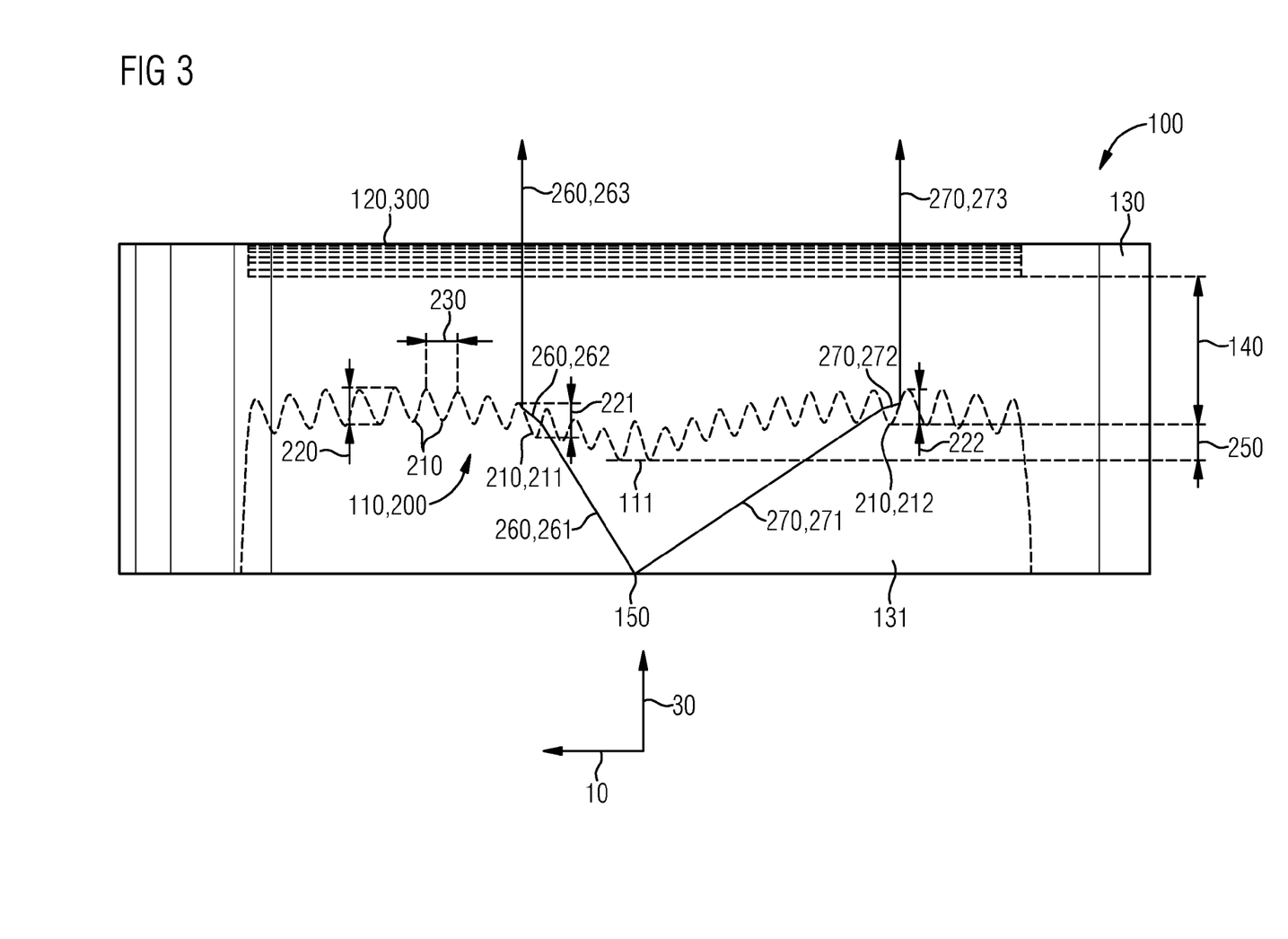
FIG. 3 shows a section perpendicular to the second direction through the optical element.

FIG. 3 shows a sectional representation of the optoelectronic element 100. The section extends perpendicularly to the y direction 20. The frame 130 of the optical element 100, the first surface 110 with the tooth structure 200, the second surface 120 with the stepped lens structure 300, and the cavity 131 arranged over the first surface 110, can be seen.

The optical element 100 is intended to be arranged on an optoelectronic component such that a radiation emission surface of an optoelectronic semiconductor chip of the optoelectronic component is arranged in the cavity 131 of the optical element 100 and faces toward the first surface 110 of the optical element 100 in the z direction 30. The optical element 100 is then intended to shape the electromagnetic radiation emerging from the radiation emission surface of the optoelectronic semiconductor chip of the optoelectronic component, for example, visible light by light refraction, i.e., to influence a ray profile of the radiation emerging from the radiation emission surface. In the schematic representation of FIG. 3, an exemplary radiation exit point 150 is marked. If the optical element 100 connects to an optoelectronic component, then the radiation emission surface of the optoelectronic semiconductor chip of the optoelectronic component may contain the radiation exit point 150.

The tooth structure 200 on the first surface 110 of the optical element 100 acts as a total internal reflection lens and is intended to deviate radiation emerging from the radiation exit point 150 in a plane perpendicular to the y direction 20. Radiation emerging from the radiation exit point 150 in the z direction 30 has a wide angle distribution in the positive and negative x directions 10. The radiation deviation in the plane perpendicular to the y direction 20 is used to reduce this angle distribution, i.e., to collimate the radiation more strongly in the z direction 30.

FIG. 3 indicates by way of example a ray profile 160 emerging from the radiation exit point 150 and a second ray profile 207 emerging from the radiation exit point 150. The first ray profile 160 comprises a first emitted ray 261 which leaves the radiation exit point 150 in a spatial direction that points partly in the z direction 30 and partly in the positive x direction 10. The second ray profile 270 likewise comprises a second emitted ray 271 pointing from the radiation exit point 150 partly in the z direction 30 and partly in the negative x direction 10.

The ray deviation takes place at the teeth 210 of the tooth structure 200 on the first surface 110 of the optical element 100. The first emitted ray 261 strikes a surface of a first tooth 211 of the tooth structure 200 and enters the material of the optical element 100 there. As the material of the optical element 100 has a different refractive index than the material (which may, for example, be air) arranged in the cavity 131, refraction and deviation of the first ray profile 260 take place at the surface of the first tooth 211. The first ray profile 260 is in this case deviated in the x direction 10 so that the first emitted ray 261 continues as a first refracted ray 262 pointing more strongly in the x direction 10.

The first refracted ray 262 passes through the first tooth 211 of the tooth structure 200 until the first refracted ray 262 strikes a second surface of the first tooth 211. The refractive index of the material of the optical element 100 and the angle of the second surface of the second tooth 211 are dimensioned such that the first refracted ray 262 striking the second surface of the first tooth 211 is subjected to total internal reflection at the second surface of the first tooth 211 and continues as a first totally reflected ray 263. The first totally reflected ray 263 points less strongly in the x direction 10 than the first emitted ray 261 and the first refracted ray 262 and may, for example, be oriented parallel to the z direction 30. The first totally reflected ray 263 can emerge from the optical element 100 at the second surface 120 of the optical element 100.

The second emitted ray 271 strikes a first surface of a second tooth 212 of the tooth structure 200, is refracted there and then travels as a second refracted ray 272 through the second tooth 212. The second refracted ray 272 is oriented more strongly in the negative x direction 10 than the second emitted ray 271. The second refracted ray 272 passes through the second tooth 212 until the second refracted ray 272 strikes the second surface of the second tooth 212. There, the second refracted ray 272 is totally reflected and continues as a second totally reflected ray 273. The second totally reflected ray 273 points less strongly in the negative x direction 10 than the second emitted ray 271 and the second refracted ray 272. The second totally reflected ray 273 may, for example, be oriented parallel to the z direction 30. The second totally reflected ray 273 can emerge from the optical element 100 at the second surface 120.

Rays leaving the radiation exit point 150 in spatial directions other than the spatial directions represented by way of example for the first ray profile 260 and for the second ray profile 270 are also deviated at the teeth 210 of the tooth structure 200 by refraction and total internal reflection in the plane perpendicular to the y direction 20. This also applies for rays emerging from a point lying next to the radiation exit point 150 in the x direction 10.

To this end, the teeth 210 of the tooth structure 200 are dimensioned suitably. In the z direction 30, the teeth 210 of the tooth structure 200 have an average tooth height 220. In this case, the height of the individual teeth 210 of the tooth structure 200 may differ from the average tooth height 220.

For example, the first tooth 211 has a first tooth height 221 which is less than a second tooth height 222 of the second tooth 212.

In the x direction 10, neighboring teeth 210 of the tooth structure 200 have an average tooth spacing 230.

In the x direction 10, the tooth structure 200 has a curve. Teeth 210 of the tooth structure 200, which are arranged close to a midpoint 111 of the first surface 110, are separated further in the z direction 30 from the second surface 120 of the optical element 100 than teeth 210 of the tooth structure 200 arranged closer to the frame 130 of the optical element 100. This curve has a curve depth 250. The teeth 210 of the tooth structure 200 lying closest to the second surface 120 of the optical element 100 therefore lie closer to the second surface 120 of the optical element 100 by the value of the curve depth 250 than the tooth 210 of the tooth structure 200 furthest away from the second surface 120.

The teeth 210 of the tooth structure 200 lying closest to the second surface 120 of the optical element 100 have a surface distance 140 from the stepped lens structure 300 on the second surface 120 of the optical element 100. The surface distance 140 is measured from the point of the stepped lens structure 300 lying closest to the first surface 110 in the z direction 30 to the point, furthest away from the second surface 120, of the tooth 210 of the tooth structure 200 lying closest the second surface 120.

The tooth structure 200 extends over the entire first surface 110 of the optical element 100. In particular, the tooth structure 200 also has teeth 210 in the region of the midpoint 111 of the first surface 110. This has the advantage that parts, arranged in the region of the cavity 131 of the optical element 100, of an optoelectronic component to which the optical element 100 is connected cannot be seen from the outside. An optoelectronic component provided with the optical element 100 can therefore be provided with an esthetically agreeable exterior.

Figure 4:
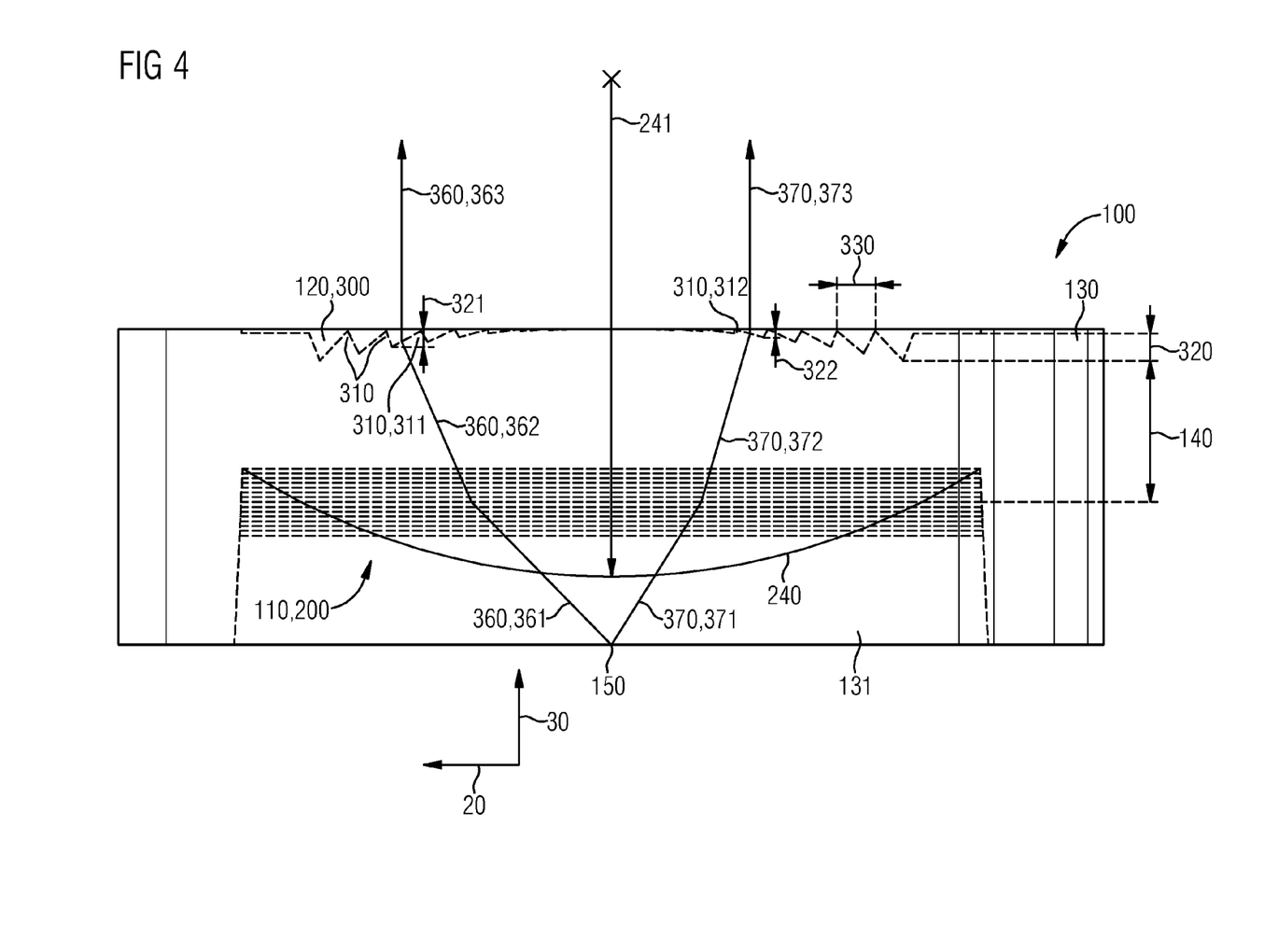
FIG. 4 shows a section perpendicular to the first direction through the optical element.

FIG. 4 shows a further representation of the optical element 100. In the representation of FIG. 4, the section extends perpendicularly to the x direction 10 and therefore also perpendicularly to the longitudinal extent direction of the steps 310 of the stepped lens structure 300 on the second surface 120 of the optical elements 100.

The stepped lens structure 300 forms a one-dimensional Fresnel lens and is used to deviate in a plane perpendicular to the x direction 10 radiation emerging from the radiation exit point 150 and collimate it in the z direction 30.

By way of example, FIG. 4 represents a third ray profile 360 and a fourth ray profile 370. The third ray profile 360 begins with a third emitted ray 361 emitted from the radiation exit point 150 in a direction pointing partly in the z direction 30 and partly in the positive y direction 20. At the first surface 110 of the optical element 100, the third emitted ray 361 enters the material of the optical element 100 and is thereby refracted in a plane perpendicular to the x direction 10. The ray continues as a third refracted ray 362. The third refracted ray 362 is oriented less in the positive y direction 20 and more strongly in the z direction 30 than the third emitted ray 361. The third refracted ray 362 travels in a straight line through the optical element 100 until it emerges from the optical element 100 at a first step 311 of the stepped lens structure 300 on the second surface 120. At the inclined surface of the first step 311, the third refracted ray 362 is refracted again and subsequently continues as a third re-refracted ray 363. The third re-refracted ray 363 is rotated relative to the third refracted ray 362 in a plane perpendicular to the x direction 10 in the z direction 30 and may, for example, travel parallel to the z direction 30.

The fourth ray profile 370 begins with a fourth emitted ray 371 emitted from the radiation exit point 150 in a direction having components in the z direction 30 and the negative y direction 20. At the first surface 110 of the optical element 100, the fourth emitted ray 371 enters the material of the optical element 100 and is thereby refracted. Inside the optical element 100, the fourth emitted ray continues as a fourth refracted ray 372. The fourth refracted ray 372 is rotated relative to the fourth emitted ray 371 in a plane perpendicular to the x direction 10 in the z direction 30. At the second surface 120 of the optical element 100, the fourth refracted ray 372 emerges through the inclined surface of a second step 312 of the stepped lens structure 310 and is thereby refracted again. The subsequent fourth re-refracted ray 373 is rotated again relative to the fourth emitted ray 372 in a plane perpendicular to the x direction 10 in the z direction 30. The fourth re-refracted ray 373 thus extends in a direction oriented more strongly in the z direction 30 than the direction of the fourth emitted ray 371 and the direction of the fourth refracted ray 372. The fourth re-refracted ray 373 may, for example, be oriented parallel to the z direction 30.

The steps 310 of the stepped lens structure 300 respectively have an inclined surface intended to reflect radiation emerging from the radiation exit point 150 in a plane perpendicular to the x direction 10 and therefore to collimate it in the z direction 30. Inclination of the steps 310 of the stepped lens structure 300 decreases from the edge of the stepped lens structure 300 to the middle of the stepped lens structure 300. Steps 310 of the stepped lens structure 300 arranged closer to the frame 130 of the optical element 100 are inclined more strongly relative to the z direction 30 than steps 310 of the stepped lens structure 300 which are further away from the frame 130 of the optical element 100. At the same time, a step height in the z direction 30 of the steps 310 of the stepped lens structure 300 decreases from the edge of the stepped lens structure 300 to the middle of the stepped lens structure 300. Thus, a first step 311 has a first step height 321, while the second step 312 as a second step height 322. Steps 310 of the stepped lens structure 300 which are next to the frame 130 have a maximum step height 320. Steps 310 of the stepped lens structure 300 arranged in the middle have a minimum step height.

In the y direction 20, neighboring steps 310 of the stepped lens structure 300 have an average step height 330.

Because of the different refractive indices of the material of the optical element 100 and the material arranged in the cavity 131, rays emerging from the radiation exit point 150 are already refracted and deviated at the first surface 110 of the optical element 100 in a plane perpendicular to the x direction 10. This ray deviation may be amplified if the teeth 210 of the tooth structure 200 on the first surface 110 of the optical element 100 are configured with a curvature in a plane perpendicular to the x direction 10. A possible curvature 240 of the teeth 210 of the tooth structure 200 with a radius of curvature 241 is schematically indicated in FIG. 4.

Figure 5:
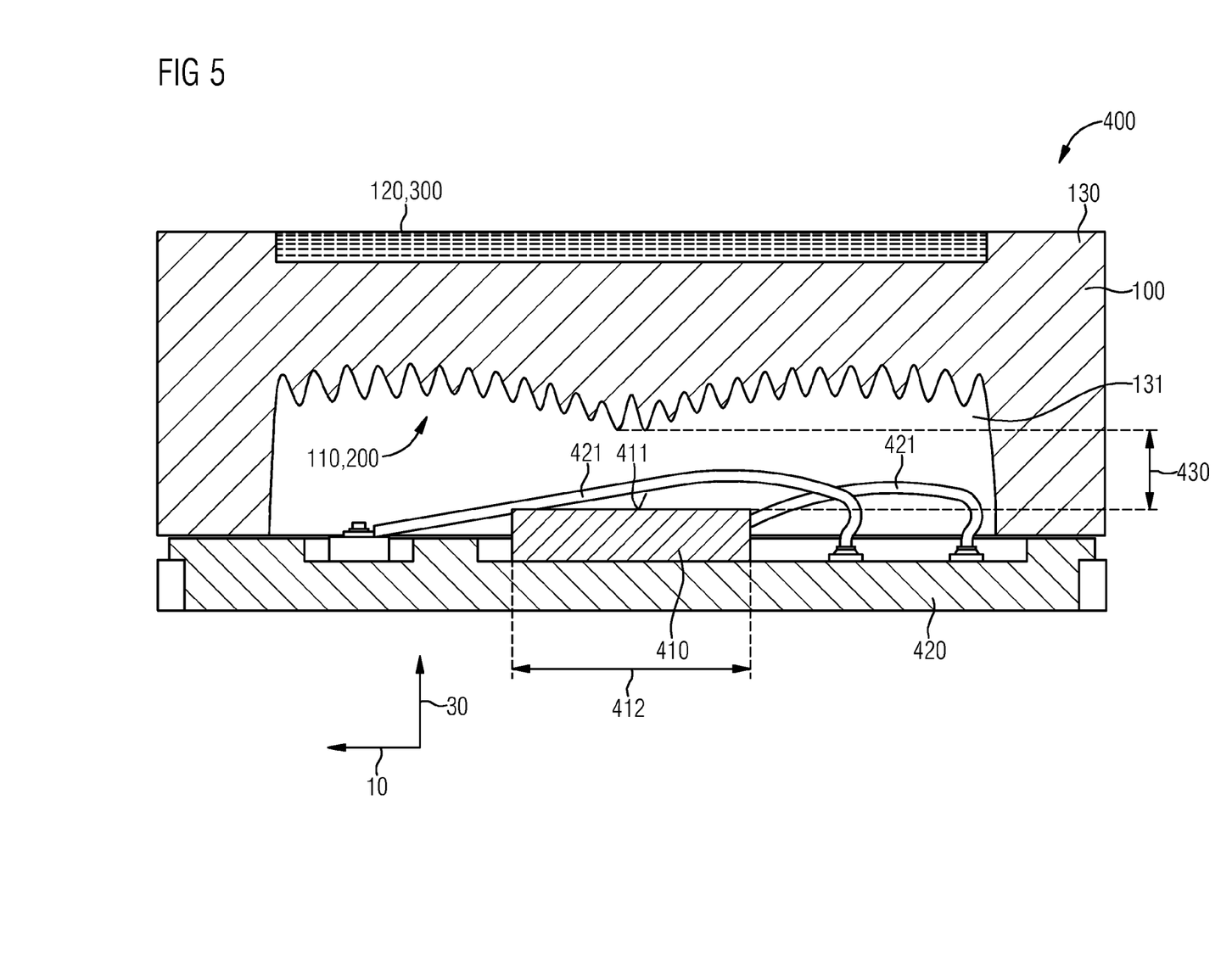
FIG. 5 shows a sectional view of an optoelectronic component.

FIG. 5 shows a schematic sectional representation of an optoelectronic component 400. The optoelectronic component 400 is equipped with the optical element 100 of FIGS. 1 to 4. In the representation of FIG. 5, similarly to the representation of FIG. 3, the section extends in a plane perpendicular to the y direction 20.

The optoelectronic component 400 comprises a carrier 420. The carrier 420 is used to receive the other parts of the optoelectronic component 400 and electrical contact of the optoelectronic component 400.

An optoelectronic semiconductor chip 410 is arranged on one surface of the carrier 420. The optoelectronic semiconductor chip 410 may, in particular, be an LED chip. In particular, the optoelectronic semiconductor chip 410 may be an LED chip emitting in the blue spectral range. The optoelectronic component 400 may then have a conversion layer that converts the blue radiation into white radiation. The optoelectronic semiconductor chip 410 electrically connects by bonding wires 421 to the carrier 420 of the optoelectronic component 400.

The optoelectronic semiconductor chip 410 comprises a radiation emission surface 411. During operation of the optoelectronic component 400, electromagnetic radiation emerges through the radiation emission surface 411 of the optoelectronic semiconductor chip 410. The radiation emission surface 410 may, for example, be configured rectangularly and has an edge length 412. The radiation emission surface 411 faces in the z direction 30.

The optical element 100 is arranged above the carrier 420 and the optoelectronic semiconductor chip 410 of the optoelectronic component 400 in the z direction 30. The radiation emission surface 411 of the optoelectronic semiconductor chip 410 is in this case arranged in the cavity 131 of the optical element 100 and faces toward the first surface 110 of the optical element 100.

Electromagnetic radiation emerging from the radiation emission surface 411 of the optoelectronic semiconductor chip 410 is collimated in the z direction 30 by the optical element 100. In this case, collimation in a plane perpendicular to the y direction 20 and partially collimation in a plane perpendicular to the x direction 10 take place at the first surface 110. Further collimation in a plane perpendicular to the x direction 10 takes place at the second surface 120 of the optical element 100.

The radiation emission surface 411 is separated by a chip distance 430 from the point of the first surface 110 of the optical element 100 lying closest to the radiation emission surface 411. Preferably, the chip distance 430 is 20% to 70% of the edge length 420 of the radiation emission surface 411.

The average tooth height 220 of the teeth 210 of the tooth structure 200 on the first surface 110 of the optical element 100 is preferably 5% to 20% of the edge length 412 of the radiation emission surface 411. The average tooth spacing 230 of the teeth 210 of the tooth structure 200 is also preferably 5% to 20% of the edge length 412 of the radiation emission surface 411. The radius of curvature 241 of the curvature 240 of the tooth structure 200 is preferably at least two times as great as the edge length 412 of the radiation emission surface 411 of the optoelectronic semiconductor chip 410. The curved depth 250 of the tooth structure 200 is preferably 20% to 50% of the edge length 412 of the radiation emission surface 411.

The maximum step height 320 of the steps 310 of the stepped lens structure 300 of the second surface 120 of the optical element 100 is preferably 5% to 20% of the edge length 412 of the radiation emission surface 411 of the optoelectronic semiconductor chip 410. The average step spacing 330 of the steps 310 of the stepped lens structure 300 is preferably 5% to 30% of the edge length 412 of the radiation emission surface 411.

Preferably, the average tooth height 220, the average tooth spacing 230, the radius of curvature 241, the curve depth 250, the maximum step height 320, the average step spacing 330 and the chip distance 430 are all in the value ranges mentioned. It is, however, also possible for one or more of these values to lie outside the value ranges mentioned.

My elements and components have been illustrated and described in detail with the aid of the preferred examples. Nevertheless, this disclosure is not restricted to the examples disclosed. Rather, other variants may be derived therefrom by those skilled in the art without departing from the protective scope of the appended claims.

The invention claimed is:

1. An optical element having a first surface and a second surface, wherein:
   a tooth structure having a multiplicity of teeth oriented in a second direction is arranged on the first surface,
   a stepped lens having a multiplicity of steps oriented in a first direction is arranged on the second surface, and
   the tooth structure forms a total internal reflection lens.

2. The optical element as claimed in claim 1, wherein the first direction and second direction form an angle of 85° to 95°.

3. The optical element as claimed in claim 1, wherein a midpoint of the first surface is covered by the tooth structure.

4. The optical element as claimed in claim 1, wherein the optical element comprises an optically transparent plastic.

5. The optical element as claimed in claim 1, wherein the first surface and the second surface are configured essentially rectangularly.

6. The optical element as claimed in claim 1, wherein the optical element comprises a frame enclosing the first surface and the second surface.

7. The optical element as claimed in claim 1, wherein the optical element shapes a radiation profile of an electromagnetic radiation emerging from a radiation surface having a defined edge length.

8. The optical element as claimed in claim 7, wherein the teeth of the tooth structure have an average tooth height of 5% to 20% of the edge length.

9. The optical element as claimed in claim 7, wherein two teeth of the tooth structure have different tooth heights.

10. The optical element as claimed in claim 7, wherein two neighboring teeth of the tooth structure have a tooth spacing of 5% to 20% of the edge length.

11. The optical element as claimed in claim 7, wherein the teeth of the tooth structure are curved in a plane perpendicular to the first direction, and
    the curvature has a radius of curvature of at least two times the edge length.

12. The optical element as claimed in claim 7, wherein the steps of the stepped lens structure have a maximum step height of 5% to 20% of the edge length.

13. The optical element as claimed in claim 7, wherein two steps of the stepped lens structure have different step heights.

14. The optical element as claimed in claim 7, wherein two neighboring steps of the stepped lens structure have a step spacing of 5% to 30% of the edge length.

15. The optical element as claimed in claim 7, wherein the tooth structure and the stepped lens structure have a distance between them of 30% to 120% of the edge length.

16. The optical element as claimed in claim 7, wherein a central section of the tooth structure is further away from the stepped lens structure than a lateral section of the tooth structure by a length, and
    the length is 20% to 50% of the edge length.

17. An optoelectronic component having an optoelectronic semiconductor chip and an optical element as claimed in claim 1.

18. The optoelectronic component as claimed in claim 17, wherein the first surface of the optical element faces toward the optoelectronic semiconductor chip.

19. The optoelectronic component as claimed in claim 18, wherein an upper side facing toward the optical element of the optoelectronic semiconductor chip has a distance from the first surface of the optical element of 20% to 70% of an edge length of a radiation emission surface of the optoelectronic semiconductor chip.

20. An optical element having a first surface and a second surface, wherein:
- a tooth structure having a multiplicity of teeth oriented parallel to a y-axis and in a second direction is arranged on the first surface,
- a stepped lens having a multiplicity of steps oriented parallel to an x-axis and in a first direction is arranged on the second surface,
- the tooth structure forms a total internal reflection lens,
- the teeth are not curved around a z-direction, but may be curved around the x-axis, the teeth are parallel to an x-z-plane formed by the x and z axes, the steps are parallel to the x-z-plane, but not necessarily parallel to the x-axis.

\* \* \* \* \*